(12) United States Patent
Bian et al.

(10) Patent No.: US 11,762,303 B2
(45) Date of Patent: Sep. 19, 2023

(54) METHOD FOR IMPROVING OVERLAY METROLOGY ACCURACY OF SELF-ALIGNED MULTIPLE PATTERNING

(71) Applicant: Shanghai Huali Integrated Circuit Corporation, Shanghai (CN)

(72) Inventors: Yuyang Bian, Shanghai (CN); Cong Zhang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 0 days.

(21) Appl. No.: 17/887,770

(22) Filed: Aug. 15, 2022

(65) Prior Publication Data
US 2023/0096180 A1    Mar. 30, 2023

(30) Foreign Application Priority Data

Sep. 28, 2021  (CN) .......................... 202111139923.1

(51) Int. Cl.
*G03F 7/00* (2006.01)

(52) U.S. Cl.
CPC ...... *G03F 7/70633* (2013.01); *G03F 7/70683* (2013.01)

(58) Field of Classification Search
CPC .......................... G03F 7/70633; G03F 7/70683
See application file for complete search history.

(56) References Cited

U.S. PATENT DOCUMENTS

| | | | | |
|---|---|---|---|---|
| 2003/0223630 A1* | 12/2003 | Adel | ...................... | G03F 9/7011 |
| | | | | 382/145 |
| 2007/0076205 A1* | 4/2007 | Schulz | ................ | G03F 7/70683 |
| | | | | 257/E23.179 |
| 2013/0217233 A1* | 8/2013 | Chang | ................. | H01L 29/6681 |
| | | | | 257/E21.214 |
| 2014/0375984 A1* | 12/2014 | Choi | ..................... | G01N 21/956 |
| | | | | 356/73 |
| 2018/0188663 A1* | 7/2018 | Levinski | ............. | G03F 7/70683 |
| 2018/0233419 A1* | 8/2018 | Liou | ................... | G03F 7/70633 |
| 2020/0212195 A1* | 7/2020 | Wang | ................... | H01L 21/0214 |
| 2020/0312687 A1* | 10/2020 | Volkovich | ........ | G05B 19/41875 |
| 2022/0413376 A1* | 12/2022 | Guler | ............. | H01L 21/823431 |

* cited by examiner

*Primary Examiner* — Steven Whitesell Gordon
(74) *Attorney, Agent, or Firm* — Banner & Witcoff, Ltd.

(57) ABSTRACT

The present application provides a method for improving overlay metrology accuracy of self-aligned multiple patterning, overlay metrology pattern comprising a front layer pattern and a current layer pattern, the front layer pattern comprising a plurality of first grating structures overlaid on the periphery of the current layer pattern, the first grating structure being composed of a plurality of repeatedly arranged strip elements; segmenting the strip element in the first grating structure, so that each of the strip elements forms a sub-grating structure comprising a plurality of repeatedly arranged strip structures; forming a plurality of repeatedly arranged core structures corresponding to the plurality of repeatedly arranged strip structures; form a gate structure comprising a plurality of repeatedly arranged fin structures; removing two outermost fin structures of the gate structure; the gate structure and the current layer pattern structure together forming an overlay metrology structure.

8 Claims, 3 Drawing Sheets

METHOD FOR IMPROVING OVERLAY METROLOGY ACCURACY OF SELF-ALIGNED MULTIPLE PATTERNING

CROSS-REFERENCES TO RELATED APPLICATIONS

This application claims priority to Chinese Patent Application No. 202111139923.1, filed on Sep. 28, 2021, the disclosure of which is incorporated herein by reference in its entirety.

TECHNICAL FIELD

The present application relates to the technical field of semiconductors, in particular to a method for improving overlay metrology accuracy of self-aligned multiple patterning.

BACKGROUND

With the advancement of integrated circuit manufacturing technologies, the critical dimension (CD) of a semiconductor device continues to shrink. The deep ultraviolet (DUV) immersion lithography machine based on a wavelength of 193 nm has a minimum resolution of 76 nm, which can no longer satisfy the requirements of continuous development of the semiconductor industry. A further reduction in the wavelength of the lithography machine, i.e., the use of extreme ultraviolet (EUV), can greatly improve the resolution of the lithography machine. However, due to limitations on the EUV lithography machine technology and related lithography materials and policy causes, it is impossible to apply the EUV lithography technology widely in the entire semiconductor manufacturing field. In order to achieve a smaller CD, self-aligned double patterning (SADP) or self-aligned quadruple patterning (SAQP) emerges and is widely applied in advanced semiconductor technology nodes. In the self-aligned multiple patterning, lithography and etching are performed for one time firstly to form a pattern, then a film of a specific thickness is uniformly deposited on the pattern, the initially formed pattern is removed subsequently by means of etching with a high selectivity ratio, a pattern deposited on a sidewall is retained, and a "fin" structure is formed eventually by means of etching. In this way, a pattern structure with a pattern period only half of the lithography pattern period is formed by means of one time of lithography, and the pattern density per unit area is doubled.

The self-aligned multiple patterning is different from the original one-shot lithography-etching patterning, and brings challenges to the design of conventional lithography alignment and metrology patterns. For example, the conventional OVL metrology pattern is usually composed of grating structures with equal line and space widths. If the conventional design is adopted in the self-aligned multiple patterning, an obtained line is composed of only a circle of very thin fins. In order to solve this problem, the original design of the line is generally modified, that is, the line is segmented to evenly divide the original line into lines each having a width about only one-tenth of the original width. In this way, an original line area is composed of dozens of fins. It is impossible to distinguish between fins in optical metrology, and eventually a periodic signal formed by a line composed of fins and a space can be obtained. The above method is the main design idea of an optical metrology pattern based on the self-aligned multiple patterning. However, since the original line is composed of dozens of fins, and etching environments for a fin in the middle and a fin on the edge are different during formation of the fins, two outermost fins may incline to different degrees. In addition, as the fin is very sensitive to an etch cavity environment due to an excessively small CD thereof, the inclination of the peripheral fins has a particular distribution on the entire silicon wafer.

BRIEF SUMMARY

In view of the above defect in the prior art, the objective of the present application is to provide a method for improving overlay metrology accuracy of self-aligned multiple patterning, so as to solve the problem of poor symmetry of an overlay metrology pattern caused by a difference in the topographies of peripheral fins in the prior art.

In order to achieve the above objective and other related objectives, the present application provides a method for improving overlay metrology accuracy of self-aligned multiple patterning, at least including:

step 1, providing an overlay metrology pattern, the overlay metrology pattern comprising a front layer pattern and a current layer pattern, the front layer pattern comprising a plurality of first grating structures overlaid on the periphery of the current layer pattern, the first grating structure being composed of a plurality of repeatedly arranged strip elements, wherein a line width of the strip element is a, a period length of the first grating structure is b, and the line width a is less than the period length b;

step 2, segmenting the strip element in the first grating structure, so that each of the strip elements forms a sub-grating structure comprising a plurality of repeatedly arranged strip structures, wherein a sub-line width of each of two outermost strip structures in the sub-grating structure is e, a sub-line width of the strip structure other than the two outermost strip structures is c, a sub-period length of the sub-grating structure is d, $c<e<2c$, the plurality of repeatedly arranged sub-grating structures form a modified first grating structure, the plurality of modified first grating structures form a modified front layer pattern, and the plurality of modified front layer patterns are overlaid on the periphery of the current layer pattern to form a modified overlay metrology pattern together with the current layer pattern;

step 3, providing a photomask provided with the modified front layer pattern, and forming, on a substrate, a plurality of repeatedly arranged core structures corresponding to the plurality of repeatedly arranged strip structures in the sub-grating structure by means of the photomask;

step 4, forming a spacer on the sidewall of the core structure;

step 5, removing the core structure in the spacer;

step 6, etching the substrate along the spacer to form a gate structure corresponding to the sub-grating structure, the gate structure comprising a plurality of repeatedly arranged fin structures;

step 7, etching and removing the two outermost fin structures of the gate structure; and step 8, forming a current layer pattern structure overlaid on the gate structure by means of the photomask provided with the current layer pattern, the gate structure and the current layer pattern structure together forming an overlay metrology structure.

In some examples, the current layer pattern in step 1 comprises a plurality of second grating structures surrounded by the front layer pattern.

In some examples, the period length b of the first grating structure in step 1 is twice the line width a of the strip element.

In some examples, the sub-line width of each of the two outermost strip structures in step 2 is e=1.5c.

In some examples, a method of forming the core structure on the substrate in step 3 comprises: first transferring the sub-grating structure to a film of the substrate by means of the photomask to form a photoresist structure; and then etching the film along the photoresist structure to form the core structure.

In some examples, a method of etching and removing the two outermost fin structures of the gate structure in step 7 comprises: first covering the gate structure with a silicon on carbon (SOC) layer; then forming a photoresist layer on the gate structure, wherein the photoresist layer covers all the fin structures in the gate structure other than the two outermost fin structures, and the width of the fin structures covered by the photoresist layer is f=a−1.5c; then etching and removing the outermost fin structures of the gate structure, and removing the SOC layer.

In some examples, the method is used for self-aligned double patterning or self-aligned quadruple patterning.

In some examples, the overlay metrology structure formed in step 8 is used for an active area layer or a polysilicon layer.

As stated above, the method for improving overlay metrology accuracy of self-aligned multiple patterning of the preset application has the following beneficial effects: in the method of the preset application, after the design of the overlay pattern and final modification of a fin in the gate structure formed by a front layer overlay mark, the outermost fin structure is removed. The symmetry of the overlay metrology pattern is improved, the impact of an etch cavity environment on the morphology of the metrology pattern is reduced, and thus the overlay metrology accuracy is improved.

DETAILED DESCRIPTION OF THE DISCLOSURE

The embodiments of the present application are described below using specific examples, and those skilled in the art can easily understand other advantages and effects of the present application from the contents disclosed in the Description. The present application can also be implemented or applied using other different specific embodiments, and various details in the Description can also be modified or changed based on different viewpoints and applications without departing from the spirit of the present application.

Please refer to FIGS. 1-11. It should be noted that the drawings provided in this embodiment are only used to illustrate the basic concept of the present application in a schematic way, so the drawings only show the components related to the present application rather than being drawn according to the number, shape, and size of the components in actual implementation. The type, number, and proportion of various components can be changed randomly during actual implementation, and the layout of components may be more complicated.

The present application provides a method for improving overlay metrology accuracy of self-aligned multiple patterning, at least including the following steps.

Step 1. An overlay metrology pattern is provided, the overlay metrology pattern including a front layer pattern and a current layer pattern, the front layer pattern including a plurality of first grating structures overlaid on the periphery of the current layer pattern, the first grating structure being composed of a plurality of repeatedly arranged strip elements, wherein a line width of the strip element is a, a period length of the first grating structure is b, and the line width a is less than the period length b.

In this embodiment of the present application, the current layer pattern in step 1 includes a plurality of second grating structures surrounded by the front layer pattern.

In this embodiment of the present application, the period length b of the first grating structure in step 1 is twice the line width a of the strip element.

Figure 1:
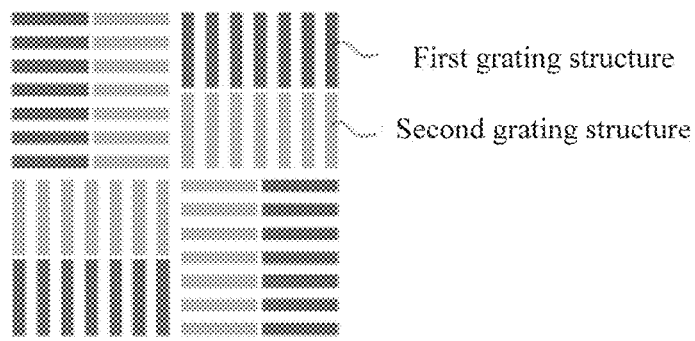
FIG. 1 is a schematic diagram of a layout structure where a current layer pattern is overlaid on a front layer pattern in the preset application.
Figure 2:
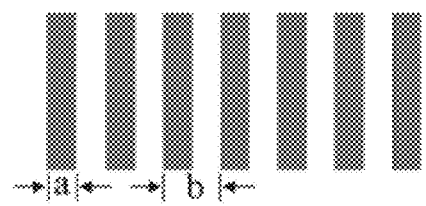
FIG. 2 is a schematic diagram of a layout of a first grating structure in the preset application.

Referring to FIG. 1, FIG. 1 is a schematic diagram of a layout structure where the current layer pattern is overlaid on the front layer pattern in the preset application. In step 1, the overlay metrology pattern is provided, the overlay metrology pattern including the front layer pattern and the current layer pattern, the front layer pattern including the plurality of first grating structures overlaid on the periphery of the current layer pattern. Referring to FIG. 2, FIG. 2 is a schematic diagram of a layout of the first grating structure in the preset application. The first grating structure is composed of the plurality of repeatedly arranged strip elements. The line width of the strip element is a, the period length of the first grating structure is b, and the line width a is less than the period length b. The period length b is the sum of the line width of the strip element and the length of a gap between the strip elements.

Referring to FIG. 1, in this embodiment of the present application, the current layer pattern in step 1 includes a plurality of second grating structures surrounded by the front layer pattern.

In this embodiment of the present application, the period length b of the first grating structure in step 1 is twice the line width a of the strip element, i.e., a=b/2.

Figure 3:
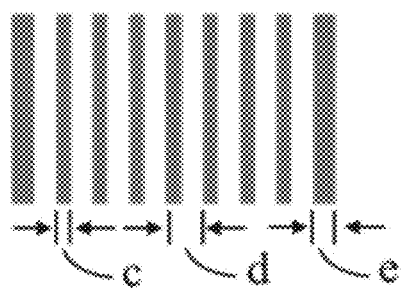
FIG. 3 is a schematic diagram of a sub-grating structure in the preset application.

Step 2. The strip element in the first grating structure is segmented, so that each of the strip elements forms a sub-grating structure comprising a plurality of repeatedly arranged strip structures. Referring to FIG. 3, FIG. 3 is a schematic diagram of the sub-grating structure in the preset application. That is, after the strip structure with the line width a in FIG. 2 is segmented in step 2, the schematic diagram of the sub-grating structure in FIG. 3 is formed.

A sub-line width of each of two outermost strip structures in the sub-grating structure is e, a sub-line width of the strip structure other than the two outermost strip structures is c, a sub-period length of the sub-grating structure is d (the sum of the line width of the strip structure and the width of a gap between the strip structure), and c<e<2c. The plurality of repeatedly arranged sub-grating structures form a modified first grating structure, the plurality of modified first grating structures form a modified front layer pattern, and the plurality of modified front layer patterns are overlaid on the periphery of the current layer pattern to form a modified overlay metrology pattern together with the current layer pattern.

In this embodiment of the present application, the sub-line width of each of the two outermost strip structures in step 2 is e=1.5c.

Step 3. A photomask provided with the modified front layer pattern is provided, and a plurality of repeatedly arranged core structures corresponding to the plurality of repeatedly arranged strip structures in the sub-grating structure are formed on a substrate by means of the photomask.

Figure 4:
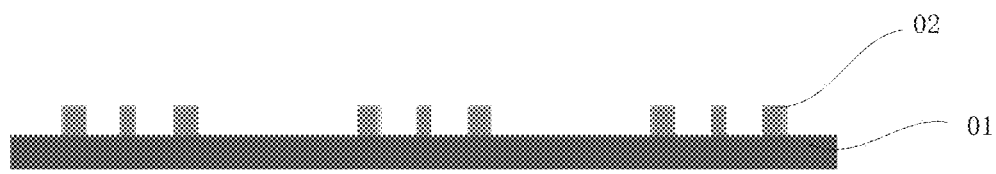
FIG. 4 is a schematic diagram where a core structure is formed on a substrate in the present application.

Referring to FIG. 4, FIG. 4 is a schematic diagram where the core structure is formed on the substrate in the present application.

In this embodiment of the present application, a method of forming the core structure 02 on the substrate in step 3 includes: first transferring the sub-grating structure to a film of the substrate 01 by means of the photomask to form a photoresist structure; and then etching the film along the photoresist structure to form the core structure 02.

Figure 5:
FIG. 5 is a schematic diagram of a structure where a spacer is formed on the sidewall of the core structure in the present application.

Step 4. A spacer is formed on the sidewall of the core structure. Referring to FIG. 5, FIG. 5 is a schematic diagram of a structure where the spacer is formed on the sidewall of the core structure in the present application. In step 4, the spacer 03 is formed on the sidewall of the core structure 02.

Figure 6:
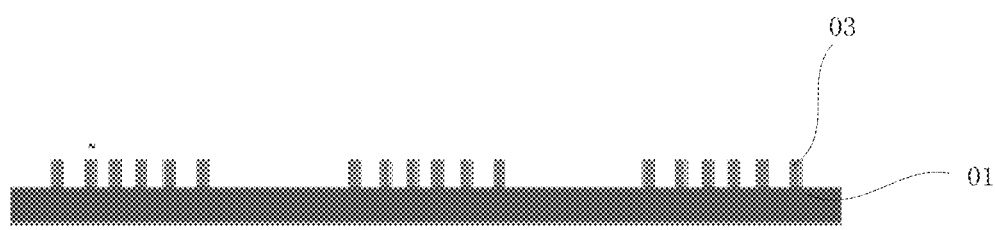
FIG. 6 is a schematic diagram of a structure where the core structure is removed and the spacer is retained in the present application.

Step 5. The core structure in the spacer is removed. Referring to FIG. 6, FIG. 6 is a schematic diagram of a structure where the core structure is removed and the spacer is retained in the present application. In step 5, the core structure in the spacer 03 is removed.

Figure 7:
FIG. 7 is a schematic diagram of a structure where a gate structure is formed in the present application.

Step 6. The substrate is etched along the spacer to form a gate structure corresponding to the sub-grating structure, the gate structure including a plurality of repeatedly arranged fin structures. Referring to FIG. 7, FIG. 7 is a schematic diagram of a structure where the gate structure is formed in the present application. In step 6, the substrate 01 is etched along the spacer 03 to form a gate structure corresponding to the sub-grating structure, the gate structure including a plurality of repeatedly arranged fin structures 04.

Step 7. The two outermost fin structures of the gate structure are etched and removed.

Figure 8:
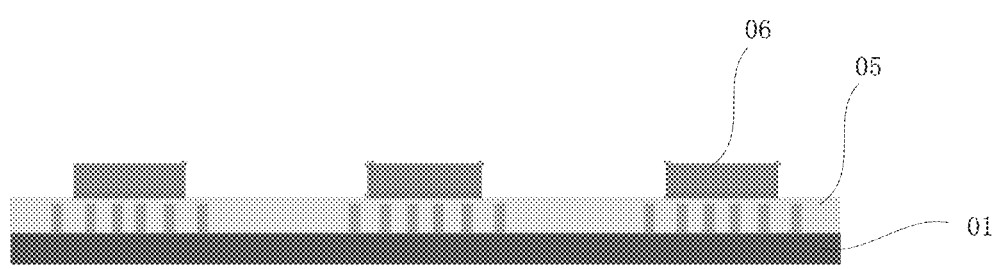
FIG. 8 is a schematic diagram of a structure where a photoresist layer is formed on a fin structure in the present application.
Figure 9:
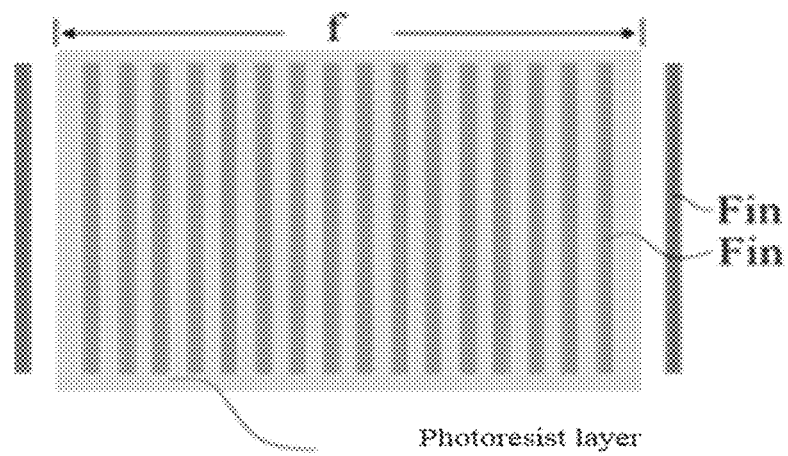
FIG. 9 is a schematic diagram of a planar structure where the photoresist layer is formed on the fin structure in the present application.
Figure 10:
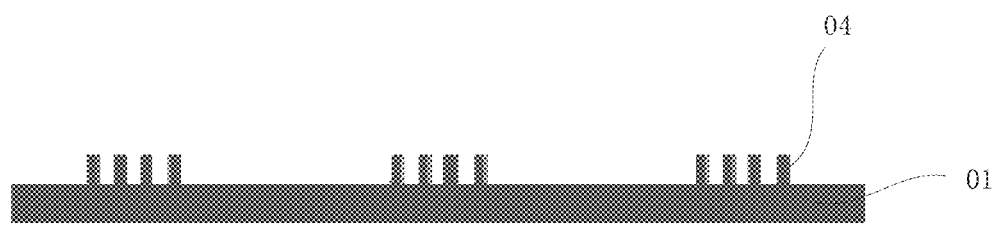
FIG. 10 is a schematic diagram of the gate structure where two outermost fin structures of the gate structure are etched and removed in the present application.

In this embodiment of the present application, a method of etching and removing the two outermost fin structures of the gate structure in step 7 includes: first covering the gate structure with an SOC layer; then forming a photoresist layer on the gate structure, wherein the photoresist layer covers all the fin structures in the gate structure other than the two outermost fin structures, and the width of the fin structures covered by the photoresist layer is f=a−1.5c; then etching and removing the outermost fin structures of the gate structure, and removing the SOC layer. Referring to FIG. 8, FIG. 8 is a schematic diagram of a structure where the photoresist layer is formed on the fin structure in the present application. The method of etching and removing the two outermost fin structures of the gate structure in step 7 includes: first covering the gate structure with the SOC layer 05; then forming the photoresist layer 06 on the gate structure, wherein the photoresist layer 06 covers all the fin structures in the gate structure other than the two outermost fin structures, and the width of the fin structures covered by the photoresist layer is f=a−1.5c; then etching and removing the outermost fin structures of the gate structure, and removing the SOC layer. Referring to FIG. 9, FIG. 9 is a schematic diagram of a planar structure where the photoresist layer is formed on the fin structure in the present application. Referring to FIG. 10, FIG. 10 is a schematic diagram of the gate structure where the two outermost fin structures of the gate structure are etched and removed in the present application.

Figure 11:
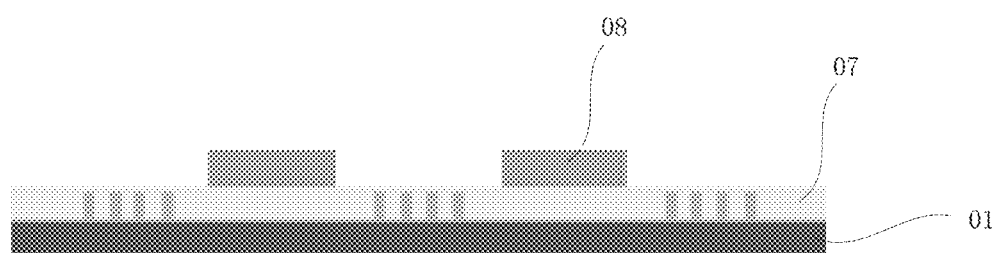
FIG. 11 is a schematic diagram of a structure where a current layer pattern is formed in the present application.

Step 8. A current layer pattern structure overlaid on the gate structure is formed by means of the photomask provided with the current layer pattern, the gate structure and the current layer pattern structure together forming an overlay metrology structure. Referring to FIG. 11, FIG. 11 is a schematic diagram of a structure where the current layer pattern is formed in the present application. In step 8, a current layer pattern structure 08 overlaid on the gate structure is formed by means of the photomask provided with the current layer pattern, the gate structure and the current layer pattern structure together forming the overlay metrology structure. Referring to FIG. 11, FIG. 11 is a schematic diagram of a structure where the current layer pattern is formed in the present application. Before the current layer pattern structure is formed, an SOC layer 07 is applied on the gate structure.

In this embodiment of the present application, the overlay metrology structure formed in step 8 is used for an active area layer or a polysilicon layer.

In this embodiment of the present application, the method is used for self-aligned double patterning or self-aligned quadruple patterning.

To sum up, in the method of the preset application, after the design of the overlay pattern and final modification of a fin in the gate structure formed by a front layer overlay mark, the outermost fin structure is removed. The symmetry of the overlay metrology pattern is improved, the impact of an etch cavity environment on the morphology of the metrology pattern is reduced, and thus the overlay metrology accuracy is improved. Therefore, the present application effectively overcomes various defects in the prior art and has high industrial utilization value.

The above embodiment merely illustrates the principle and effect of the present application, rather than limiting the present application. Anyone skilled in the art can modify or change the above embodiment without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A method for improving overlay metrology accuracy of self-aligned multiple patterning, at least comprising:

step 1, providing an overlay metrology pattern, the overlay metrology pattern comprising a front layer pattern and a current layer pattern, the front layer pattern comprising a plurality of first grating structures overlaid on a periphery of the current layer pattern, the first grating structure being composed of a plurality of repeatedly arranged strip elements, wherein a line width of the strip element is a, a period length of the first grating structure is b, and the line width a is less than the period length b;

step 2, segmenting the strip element in the first grating structure, so that each of the strip elements forms a sub-grating structure comprising a plurality of repeatedly arranged strip structures, wherein a sub-line width of each of two outermost strip structures in the sub-grating structure is e, a sub-line width of the strip structure other than the two outermost strip structures is c, a sub-period length of the sub-grating structure is d, c<e<2c, the plurality of repeatedly arranged sub-grating structures form a modified first grating structure, the plurality of modified first grating structures form a modified front layer pattern, and the plurality of modified front layer patterns are overlaid on the periphery of the current layer pattern to form a modified overlay metrology pattern together with the current layer pattern;

step 3, providing a photomask provided with the modified front layer pattern, and forming, on a substrate, a plurality of repeatedly arranged core structures corresponding to the plurality of repeatedly arranged strip structures in the sub-grating structure by means of the photomask;

step 4, forming a spacer on a sidewall of the core structure;

step 5, removing the core structure in the spacer;

step 6, etching the substrate along the spacer to form a gate structure corresponding to the sub-grating structure, the gate structure comprising a plurality of repeatedly arranged fin structures;

step 7, etching and removing the two outermost fin structures of the gate structure; and step 8, forming a current layer pattern structure overlaid on the gate structure by means of the photomask provided with the current layer pattern, the gate structure and the current layer pattern structure together forming an overlay metrology structure.

2. The method for improving overlay metrology accuracy of self-aligned multiple patterning according to claim 1, wherein the current layer pattern in step 1 comprises a plurality of second grating structures surrounded by the front layer pattern.

3. The method for improving overlay metrology accuracy of self-aligned multiple patterning according to claim 1, wherein the period length b of the first grating structure in step 1 is twice the line width a of the strip element.

4. The method for improving overlay metrology accuracy of self-aligned multiple patterning according to claim 1, wherein the sub-line width of each of the two outermost strip structures in step 2 is e=1.5c.

5. The method for improving overlay metrology accuracy of self-aligned multiple patterning according to claim 1, wherein a method of forming the core structure on the substrate in step 3 comprises: first transferring the sub-grating structure to a film of the substrate by means of the photomask to form a photoresist structure; and then etching the film along the photoresist structure to form the core structure.

6. The method for improving overlay metrology accuracy of self-aligned multiple patterning according to claim 1, wherein a method of etching and removing the two outermost fin structures of the gate structure in step 7 comprises: first covering the gate structure with an silicon on carbon (SOC) layer; then forming a photoresist layer on the gate structure, wherein the photoresist layer covers all the fin structures in the gate structure other than the two outermost fin structures, and the width of the fin structures covered by the photoresist layer is f=a−1.5c; then etching and removing the outermost fin structures of the gate structure, and removing the SOC layer.

7. The method for improving overlay metrology accuracy of self-aligned multiple patterning according to claim 1, wherein the method is used for self-aligned double patterning or self-aligned quadruple patterning.

8. The method for improving overlay metrology accuracy of self-aligned multiple patterning according to claim 1, wherein the overlay metrology structure formed in step 8 is used for an active area layer or a polysilicon layer.

\* \* \* \* \*